US012243458B2

(12) United States Patent  
Tian et al.

(10) Patent No.: US 12,243,458 B2
(45) Date of Patent: Mar. 4, 2025

(54) DISPLAY PANEL USING AUXILIARY DRIVING UNITS AND ELECTRONIC DEVICE

(71) Applicant: WUHAN CHINA STAR OPTOELECTRONICS TECHNOLOGY CO., LTD., Hubei (CN)

(72) Inventors: Chao Tian, Hubei (CN); Yanqing Guan, Hubei (CN); Guanghui Liu, Hubei (CN); Fei Ai, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/596,876

(22) PCT Filed: Dec. 14, 2021

(86) PCT No.: PCT/CN2021/137987
§ 371 (c)(1),
(2) Date: Dec. 20, 2021

(87) PCT Pub. No.: WO2023/097778
PCT Pub. Date: Jun. 8, 2023

(65) Prior Publication Data
US 2024/0221564 A1 Jul. 4, 2024

(30) Foreign Application Priority Data

Dec. 2, 2021 (CN) .......................... 202111458302.X

(51) Int. Cl.
G09G 3/20 (2006.01)
H01L 27/12 (2006.01)

(52) U.S. Cl.
CPC ............ G09G 3/20 (2013.01); H01L 27/124 (2013.01); G09G 2310/0281 (2013.01)

(58) Field of Classification Search
None
See application file for complete search history.

(56) References Cited

U.S. PATENT DOCUMENTS 11,348,533 B1* 5/2022 Ono ..................... G09G 3/3266
2012/0162179 A1 6/2012 Tanaka
2014/0055329 A1 2/2014 Ohara

FOREIGN PATENT DOCUMENTS

CN 108877624 A 11/2018
CN 111312177 A 6/2020
(Continued)

OTHER PUBLICATIONS

WO2018229916A1 espacenet translation (Year: 2018).*

Primary Examiner — Amr A Awad
Assistant Examiner — Donna V Bocar

(57) ABSTRACT

The present application provides a display panel and an electronic device. The electronic device comprises the display panel. The display panel comprises a gate driving unit, a first auxiliary driving unit and scan lines. The first auxiliary driving unit rapidly pulls down the falling edge of the scan signal transmitted in the scan line to reduce the delay of the falling edge of the scan line. Thus, the number of gate driving units in the display panel can be reduced, thereby reducing the width of the frame of the display panel and the electronic device.

16 Claims, 7 Drawing Sheets

(56) References Cited

FOREIGN PATENT DOCUMENTS

| | | | |
|---|---|---|---|
| CN | 111883074 A | 11/2020 | |
| CN | 113257134 A | 8/2021 | |
| IN | 103280201 A | 9/2013 | |
| IN | 108806635 A | 11/2018 | |
| WO | WO-2018229916 A1 * | 12/2018 | ............... G09G 3/20 |

* cited by examiner

DISPLAY PANEL USING AUXILIARY DRIVING UNITS AND ELECTRONIC DEVICE

FIELD OF THE INVENTION

The present invention relates to a display technology field, and more particularly to a display panel and an electronic device.

BACKGROUND OF THE INVENTION

At present, the display panel as a display component of an electronic device has been widely used in various electronic products, and the gate driving circuit is an important part of the display panel. Gate Driver On Array (GOA) technology is a kind of technology that the thin film transistor array (Array) process is utilized to manufacture the gate driving circuit on the array substrate to realize the driving manner of scanning the gates row by row. With the continuous development of current display applications, the appearance and size of display panels are constantly breaking through, and more and more application scenarios have more diverse needs for display panels. However, the current mainstream driving architecture of the display panel is still to accomplish the update of the display data by the data input terminals driven by the source driving chip and the gate driving terminals driven by the gate driving chip or the gate driving circuit.

At present, the signal driving terminals of the display panel are generally distributed on the periphery of the active area of the display panel. As the size of the display panel continues to expand, the signal transmission delay becomes larger and larger. Currently, products of medium size and above generally adopt the GOA dual driving method, that is, both terminals of the scan line are designed with gate driving circuits to drive the scan line to reduce the signal delay. However, designing gate driving circuits at both terminals of the scan line will increase the width of the left and right frames of the display panel, which is contrary to the current consumer demand for narrow frame.

There is the problem that the existing display panel and electronic device adopts the GOA dual driving structure will increase the frame width of the display panel. Therefore, there is a need to provide a display panel and an electronic device to improve this defect.

SUMMARY OF THE INVENTION

The embodiments of the present application provide a display panel and an electronic device, which are employed to solve the problem that the existing display panel and electronic device adopts the GOA dual driving structure which increases the frame width of the display panel.

The embodiment of the present application provides a display panel, comprising an active area and a non-active area arranged at a periphery of the active area, wherein the display panel further comprises:
  a plurality of gate driving units, which are cascaded and arranged in the non-active area;
  a plurality of first auxiliary driving units, which are cascaded and arranged in the non-active area;
  a plurality of scan lines at least partially arranged in the active area; and
  wherein the Nth stage gate driving unit is electrically connected to a first terminal of the Nth scan line, and an output terminal of the Nth stage first auxiliary driving unit is electrically connected to a second terminal of the Nth scan line, and an input terminal of the Nth stage first auxiliary driving unit is electrically connected to a driving source signal line, and a control terminal of the Nth stage first auxiliary driving unit is electrically connected to a (N+M)th scan line, and both N and M are positive integers.

According to one embodiment of the present application, the Nth stage gate driving unit and the (N+1)th stage gate driving unit are respectively arranged on opposite sides of the active area and staggered along a row direction, and the (N+1)th stage gate driving unit and the Nth stage first auxiliary driving unit are arranged on a same side of the active area, and the Nth stage first auxiliary driving unit is arranged on a side of the (N+1)th stage gate driving unit close to the Nth stage gate driving unit in a column direction.

According to one embodiment of the present application, the first auxiliary driving unit comprises a first thin film transistor;
  wherein in the Nth stage first auxiliary driving unit, one of a source and a drain of the first thin film transistor is electrically connected to the second terminal of the Nth scan line, and an other of the source and the drain of the first thin film transistor is electrically connected to the driving source signal line, and a gate of the first thin film transistor is electrically connected to the (N+M)th scan line.

According to one embodiment of the present application, the first thin film transistor is an N-channel thin film transistor, and a signal transmitted by the driving source signal line is a constant voltage low potential signal, and the driving source signal line is perpendicular to the plurality of scan lines.

According to one embodiment of the present application, the first thin film transistor is an N-channel thin film transistor, and the driving source signal line is the (N+X)th scan line;
  wherein X is a positive integer greater than or equal to M+1.

According to one embodiment of the present application, the display panel further comprises at least one set of second auxiliary driving units arranged in the active area, and each set of the second auxiliary driving units possesses a plurality of second auxiliary driving units, which are cascaded, and at least one connection node is provided between the first terminal and the second terminal of the Nth scan line;
  wherein an output terminal of the Nth stage second auxiliary driving unit is electrically connected to the connection node of the Nth scan line, and an input terminal of the Nth stage second auxiliary driving unit is electrically connected to the driving source signal line, and a control terminal of the Nth stage second auxiliary driving unit is electrically connected to the (N+M)th scan line.

According to one embodiment of the present application, the second auxiliary driving unit comprises a second thin film transistor;
  wherein in the Nth stage second auxiliary driving unit, one of a source and a drain of the second thin film transistor is electrically connected to the connection node of the Nth scan line, and an other of the source and the drain of the second thin film transistor is electrically connected to the driving source signal line, and a gate of the second thin film transistor is electrically connected to the (N+M)th scan line.

According to one embodiment of the present application, the second thin film transistor is of a same type as the first thin film transistor.

According to one embodiment of the present application, the display panel further comprises a pixel driving circuit located in the active area, and the pixel driving circuit comprises a plurality of thin film transistors, and the second thin film transistor is arranged in a same layer as at least one of the thin film transistors in the pixel driving circuit.

The embodiment of the present application further provides an electronic device, comprising a display panel, wherein the display panel comprises an active area and a non-active area arranged at a periphery of the active area, and the display panel further comprises:

a plurality of gate driving units, which are cascaded and arranged in the non-active area;
a plurality of first auxiliary driving units, which are cascaded and arranged in the non-active area;
a plurality of scan lines at least partially arranged in the active area; and
wherein the Nth stage gate driving unit is electrically connected to a first terminal of the Nth scan line, and an output terminal of the Nth stage first auxiliary driving unit is electrically connected to a second terminal of the Nth scan line, and an input terminal of the Nth stage first auxiliary driving unit is electrically connected to a driving source signal line, and a control terminal of the Nth stage first auxiliary driving unit is electrically connected to a (N+M)th scan line, and both N and M are positive integers.

According to one embodiment of the present application, the Nth stage gate driving unit and the (N+1)th stage gate driving unit are respectively arranged on opposite sides of the active area and staggered along a row direction, and the (N+1)th stage gate driving unit and the Nth stage first auxiliary driving unit are arranged on a same side of the active area, and the Nth stage first auxiliary driving unit is arranged on a side of the (N+1)th stage gate driving unit close to the Nth stage gate driving unit in a column direction.

According to one embodiment of the present application, the first auxiliary driving unit comprises a first thin film transistor;

wherein in the Nth stage first auxiliary driving unit, one of a source and a drain of the first thin film transistor is electrically connected to the second terminal of the Nth scan line, and an other of the source and the drain of the first thin film transistor is electrically connected to the driving source signal line, and a gate of the first thin film transistor is electrically connected to the (N+M)th scan line.

According to one embodiment of the present application, the first thin film transistor is an N-channel thin film transistor, and a signal transmitted by the driving source signal line is a constant voltage low potential signal, and the driving source signal line is perpendicular to the plurality of scan lines.

According to one embodiment of the present application, the first thin film transistor is an N-channel thin film transistor, and the driving source signal line is the (N+X)th scan line;

wherein X is a positive integer greater than or equal to M+1.

According to one embodiment of the present application, the display panel further comprises at least one set of second auxiliary driving units arranged in the active area, and each set of the second auxiliary driving units possesses a plurality of second auxiliary driving units, which are cascaded, and at least one connection node is provided between the first terminal and the second terminal of the Nth scan line;

wherein an output terminal of the Nth stage second auxiliary driving unit is electrically connected to the connection node of the Nth scan line, and an input terminal of the Nth stage second auxiliary driving unit is electrically connected to the driving source signal line, and a control terminal of the Nth stage second auxiliary driving unit is electrically connected to the (N+M)th scan line.

According to one embodiment of the present application, the second auxiliary driving unit comprises a second thin film transistor;

wherein in the Nth stage second auxiliary driving unit, one of a source and a drain of the second thin film transistor is electrically connected to the connection node of the Nth scan line, and an other of the source and the drain of the second thin film transistor is electrically connected to the driving source signal line, and a gate of the second thin film transistor is electrically connected to the (N+M)th scan line.

According to one embodiment of the present application, the second thin film transistor is of a same type as the first thin film transistor.

According to one embodiment of the present application, the display panel further comprises a pixel driving circuit located in the active area, and the pixel driving circuit comprises a plurality of thin film transistors, and the second thin film transistor is arranged in a same layer as at least one of the thin film transistors in the pixel driving circuit.

The benefits of the present disclosure are: The embodiment of the present application provides a display panel and an electronic device. The electronic device comprises the display panel. The display panel comprises an active area and a non-active area arranged at a periphery of the active area, wherein the display panel further comprises a plurality of cascaded gate driving units, a plurality of cascaded first auxiliary driving units, a plurality of scan lines and at least one driving source signal line. The gate driving unit and the first auxiliary driving unit are both arranged in the non-active area, and the scan lines are at least partially arranged in the active area. The Nth stage gate driving unit is electrically connected to a first terminal of the Nth scan line, and an output terminal of the Nth stage first auxiliary driving unit is electrically connected to a second terminal of the Nth scan line, and an input terminal of the Nth stage first auxiliary driving unit is electrically connected to a driving source signal line, and a control terminal of the Nth stage first auxiliary driving unit is electrically connected to a (N+M)th scan line. Thereby, the first auxiliary driving unit rapidly pulls down the falling edge of the scan signal transmitted in the scan line to reduce the delay of the falling edge of the scan line to achieve or approximate the driving effect of GOA dual driving. Thus, the number of gate driving units in the display panel can be reduced, thereby reducing the width of the frame of the display panel and the electronic device.

BRIEF DESCRIPTION OF THE DRAWINGS

In order to more clearly illustrate the embodiments of the present disclosure or prior art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF PREFERRED EMBODIMENTS

Figure 1:
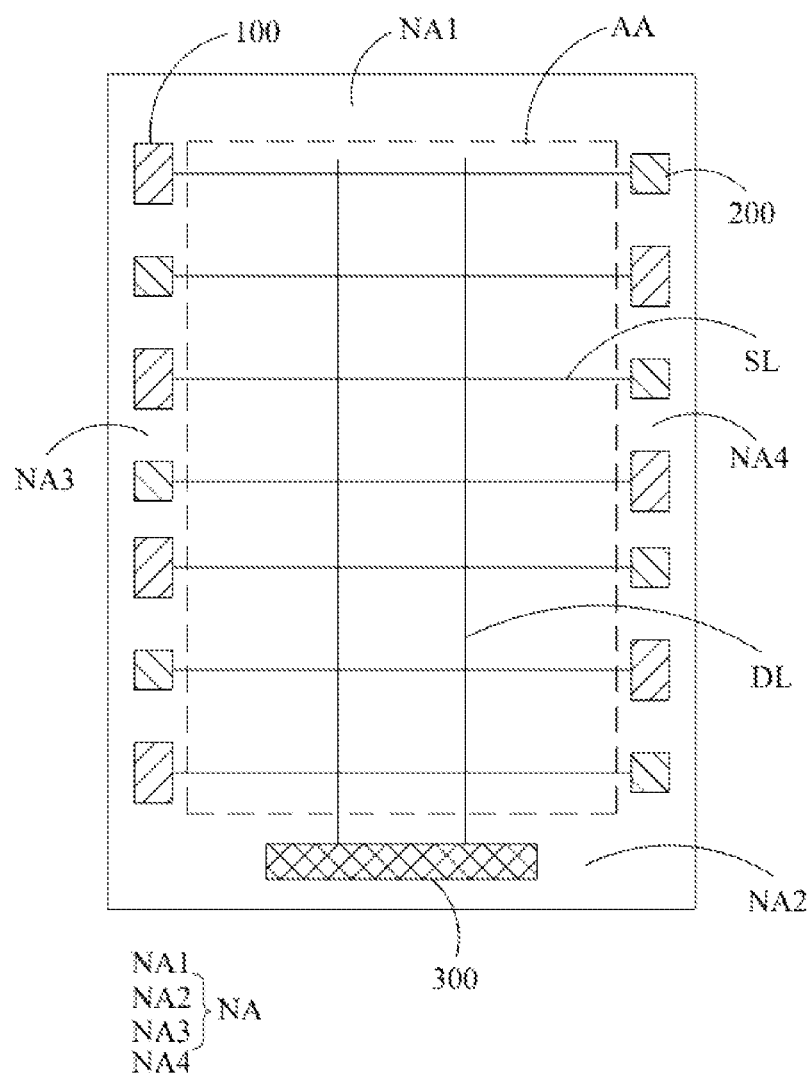
FIG. 1 is a diagram of an overall structure of a display panel provided by an embodiment of the application.

The following descriptions for the respective embodiments are specific embodiments capable of being implemented for illustrations of the present application with referring to appended figures. The terms of up, down, front, rear, left, right, interior, exterior, side, etcetera in the present application are merely directions of referring to appended figures. Thus, the used directional terms are used to describe and understand the present application, but the present invention is not limited thereto. In the figure, units with similar structures are denoted by the same reference numerals.

The present disclosure will be further described in detail with the accompanying drawings and the specific embodiments.

The embodiment of the present application provides a display panel and an electronic device. The electronic device comprises the display panel. The electronic device may be a mobile terminal, such as a smart phone, a tablet computer, a notebook computer, etc. The electronic device may also be a wearable terminal, such as a smart watch, a smart bracelet, smart glasses, an augmented reality device, etc. The electronic device may also be a fixed terminal, such as a desktop computer, a television, etc.

The display panel may be a liquid crystal display panel, or may be any one of an organic light emitting diode display panel or a micro light emitting diode display panel.

As shown in FIG. 1, FIG. 1 is a diagram of an overall structure of a display panel provided by an embodiment of the application. The display panel comprises an active area AA and a non-active area NA. The non-active area NA is arranged at a periphery of the active area AA. The display panel comprises a plurality of gate driving units 100, which are cascaded and a plurality of scan lines SL.

Figure 2:
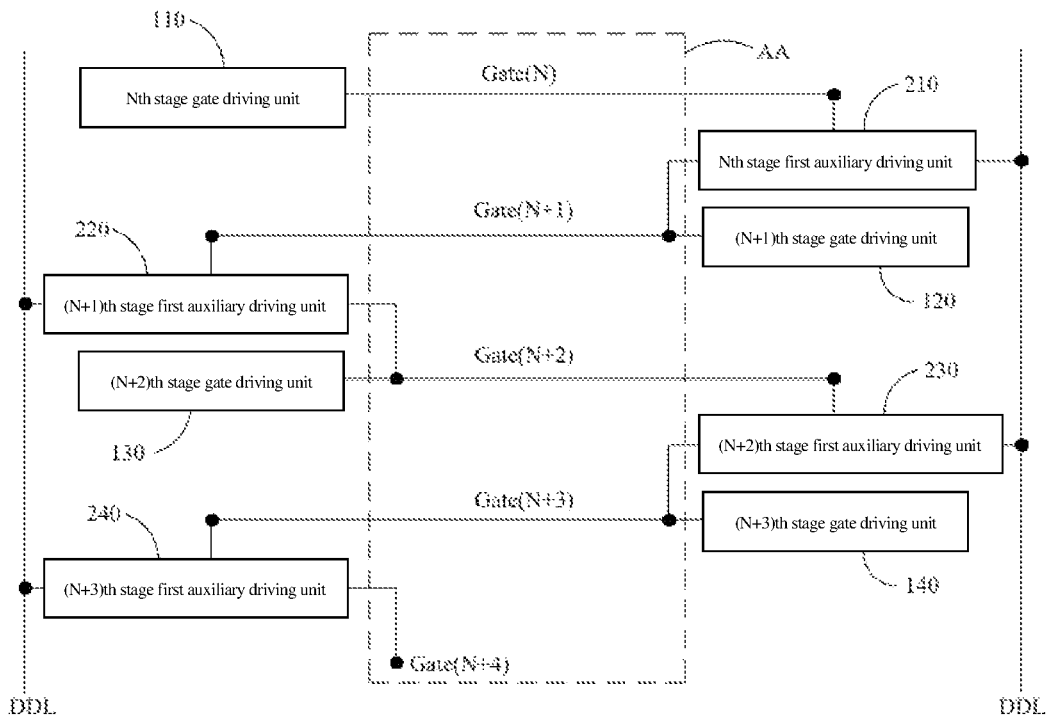
FIG. 2 is a structural diagram of a first display panel provided by an embodiment of the application.

As shown in FIG. 2, FIG. 2 is a structural diagram of a first display panel provided by an embodiment of the application. The Nth stage gate driving unit 110 is employed to transmit the Nth stage gate driving signal Gate(N), and the scan line SL is at least partially located in the active area AA of the display panel. The output terminal of the Nth stage gate driving unit 110 is electrically connected to the first terminal of the Nth scan line SL, and N is a positive integer.

The display panel further comprises a plurality of cascaded first auxiliary driving units 200, and the plurality of first auxiliary driving units 200 are all disposed in the non-active area NA, wherein the output terminal of the Nth stage first auxiliary driving unit 210 is electrically connected to the second terminal of the Nth scan line SL, and the input terminal of the Nth stage first auxiliary driving unit 210 receives the driving source signal, and the control terminal of the Nth stage first auxiliary driving unit 210 is electrically connected to a (N+M)th scan line to pull down the falling edge of the Nth stage gate driving signal G(N), and M is a positive integer. Each gate drive unit in the cascade can output driving signals with the same frequency and different phases. For instance, the falling edge of the Nth stage gate drive signal Gate(N) can be synchronized with the rising edge of the (N+1)th stage gate drive signal Gate(N+1). Alternately, the rising edge of the (N+1)th stage gate drive signal Gate(N+1) slightly lags the falling edge of the Nth stage gate drive signal Gate(N).

In the embodiment of the present application, as shown in FIG. 1, the non-active area NA may comprise a first non-active sub-area NA1, a second non-active sub-area NA2, a third non-active sub-area NA3, and a fourth non-active sub-area NA4. When the display panel is viewed in the front, the first non-active sub-area NA1 may be located on the upper side of the active area AA, the second non-active sub-area NA2 may be located on the lower side of the active area AA, and the third non-active sub-area NA3 may be located on the active area on the left side of the area AA, and the fourth non-active sub-area NA4 may be located on the right side of the active area AA.

The display panel may further comprise a source driver 300 and a plurality of data lines DL, and the source driver 300 is electrically connected to the plurality of data lines DL. The source driver 300 may be located in the second active sub-area NA2, and the data line DL may extend from the second non-active sub-area NA2 to the active area AA. The source driver 300 may be a source driving integrated circuit for outputting corresponding data signals.

Furthermore, the Nth stage gate driving unit is electrically connected to a first terminal of the Nth scan line, and an output terminal of the Nth stage first auxiliary driving unit is electrically connected to a second terminal of the Nth scan line, and an input terminal of the Nth stage first auxiliary driving unit receives a driving source signal, and a control terminal of the Nth stage first auxiliary driving unit is electrically connected to a (N+M)th scan line, and both N and M are positive integers.

As shown in FIG. 2, in one of the embodiments, the display panel may comprise an Nth stage gate driving unit 110, an (N+1)th stage gate driving unit 120, an (N+2)th stage gate driving unit 130 and an (N+3)th stage gate driving unit 140, where N is a positive integer and M=1.

The Nth stage gate driving unit 110 is employed to transmit the Nth stage gate driving signal Gate(N), and the output terminal of the Nth stage gate driving unit 110 is connected to the first terminal of the Nth scan line; the (N+1)th stage gate driving unit 120 is employed to transmit the (N+1)th stage gate driving signal Gate(N+1), and the output terminal of the (N+1)th stage gate driving unit 120 is connected to the first terminal of the (N+1)th scan line; the (N+2)th stage gate driving unit 130 is employed to transmit the (N+2)th stage gate driving signal Gate(N+2), and the output terminal of the (N+2)th stage gate driving unit 130 is connected to the first terminal of the (N+2)th scan line; the (N+3)th stage gate driving unit 140 is employed to transmit the (N+3)th stage gate driving signal Gate(N+3), and the output terminal of the (N+3)th stage gate driving unit 140 is connected to the first terminal of the (N+3)th scan line.

The output terminal of the Nth stage first auxiliary driving unit 210 is connected to the second terminal of the Nth scan line, and the control terminal of the Nth stage first auxiliary driving unit 210 is connected to the (N+1)th scan line. The falling edge of the Nth stage gate drive signal Gate(N) can be at the same timing with the rising edge of the (N+1)th stage gate drive signal Gate(N+1). Alternately, the rising edge of the (N+1)th stage gate drive signal Gate(N+1) slightly lags the falling edge of the Nth stage gate drive signal Gate(N). The output terminal of the (N+1)th stage first auxiliary driving unit 220 is connected to the second terminal of the (N+1)th scan line, and the control terminal of the (N+1)th stage first auxiliary driving unit 220 is connected to the (N+2)th scan line. The falling edge of the (N+1)th stage gate drive signal Gate(N+1) can be at the same timing with the rising edge of the (N+2)th stage gate drive signal Gate(N+2). Alternately, the rising edge of the (N+2)th stage gate drive signal Gate(N+2) slightly lags the falling edge of the (N+1)th stage gate drive signal Gate(N+1); the output terminal of the (N+2)th stage first auxiliary driving unit 230 is connected to the second terminal of the (N+2)th scan line, and the control terminal of the (N+2)th stage first auxiliary driving unit 230 is connected to the (N+3)th scan line. The falling edge of the (N+2)th stage gate drive signal Gate(N+2) can be at the same timing with the rising edge of the (N+3)th stage gate drive signal Gate(N+3). Alternately, the rising edge of the (N+3)th stage gate drive signal Gate(N+3) slightly lags the falling edge of the (N+2)th stage gate drive signal Gate(N+2).

The display panel may further comprises driving source signal lines DDL. The plurality of the driving source signal lines DDL are perpendicular to the plurality of the scan lines SL. The driving source signal line DDL is connected to the input terminal of the Nth stage first auxiliary driving unit 210 and/or the input terminal of the (N+1)th stage first auxiliary driving unit 220. The driving source signal line DDL may be employed to transmit a driving source signal, and the driving source signal possesses at least a partial low potential state.

Furthermore, the Nth stage gate driving unit and the (N+1)th stage gate driving unit are respectively arranged on opposite sides of the active area AA and staggered along the row direction x. The (N+1)th stage gate driving unit and the Nth stage first auxiliary driving unit are arranged on the same side of the active area. The Nth stage first auxiliary driving unit is arranged on the side of the (N+1)th stage gate driving unit close to the Nth stage gate driving unit in the column direction y, wherein the row direction x is a horizontal direction, and the column direction y is a vertical direction perpendicular to the row direction x. As shown in FIG. 2, the Nth stage gate driving unit 110 is located in the third non-active sub-region NA3 on the left side of the active area AA, and the (N+1)th stage gate driving unit 120 is located in the fourth non-active sub-region NA4 on the right side of the active area AA. The Nth stage gate driving unit 110 and the (N+1)th stage gate driving unit 120 are staggered in the row direction x. The Nth stage first auxiliary driving unit 210 and the (N+1)th stage gate driving unit 120 are both arranged in the fourth non-active sub-region on the right side of the active area AA. The Nth stage first auxiliary driving unit 210 is arranged on the side of the (N+1)th stage gate driving unit close to the Nth stage gate driving unit in the column direction y.

Specifically, since in each scan line, the transmission delay of the gate driving signal far from the gate driving unit is greater than the transmission delay of the gate driving signal close to the gate driving unit, and if all cascaded gate driving units are arranged on the same side of the active area AA, there will be a larger transmission delay difference between the area far away from the gate driving unit and the area close to the gate driving unit in the active area AA, thus resulting in a horizontal display difference in the active area AA. By arranging the gate driving units of any two adjacent stages on opposite sides of the active area AA, the transmission delays of the gate driving signals in the area close to the gate driving unit and the area far from the gate driving unit of the active area AA can be consistent, thereby improving the problem of the horizontal display difference in the active area AA.

The working logic of the Nth stage first auxiliary driving unit 210 is used for illustration. When the Nth stage gate driving signal starts the falling edge, the (N+1)th stage gate driving signal G(N+1) starts the rising edge. At this time, the Nth stage first auxiliary driving unit 210 controlled by the (N+1)th stage gate driving signal G(N+1) is activated, and the corresponding driving source signal activated by the first auxiliary driving unit 210 of the Nth stage is at a low level. The Nth stage first auxiliary driving unit 210 outputs the driving source signal to the Nth scan line. Accordingly, the Nth stage gate drive signal Gate(N) transmitted by the Nth scan line drops rapidly, thereby reducing the transmission delay of the gate driving signal far away from the Nth stage gate driving unit 110 in the Nth scan line. This enables one Nth stage gate driving unit 110 to achieve or approach the dual driving effect of two opposite Nth stage gate driving units 110. By analogy, the working logic of the first auxiliary driving units of the other stages are the same as the working logic of the Nth stage first auxiliary driving unit, and will not be repeated here. Through the rapid pull-down of the gate driving signal in the corresponding scan line by the plurality of cascaded first auxiliary driving units, the transmission delay of the gate driving signal can be reduced and the number of gate driving units arranged in the non-active area NA can also be reduced, thereby decreasing the width of the frame of the display panel.

Figure 3:
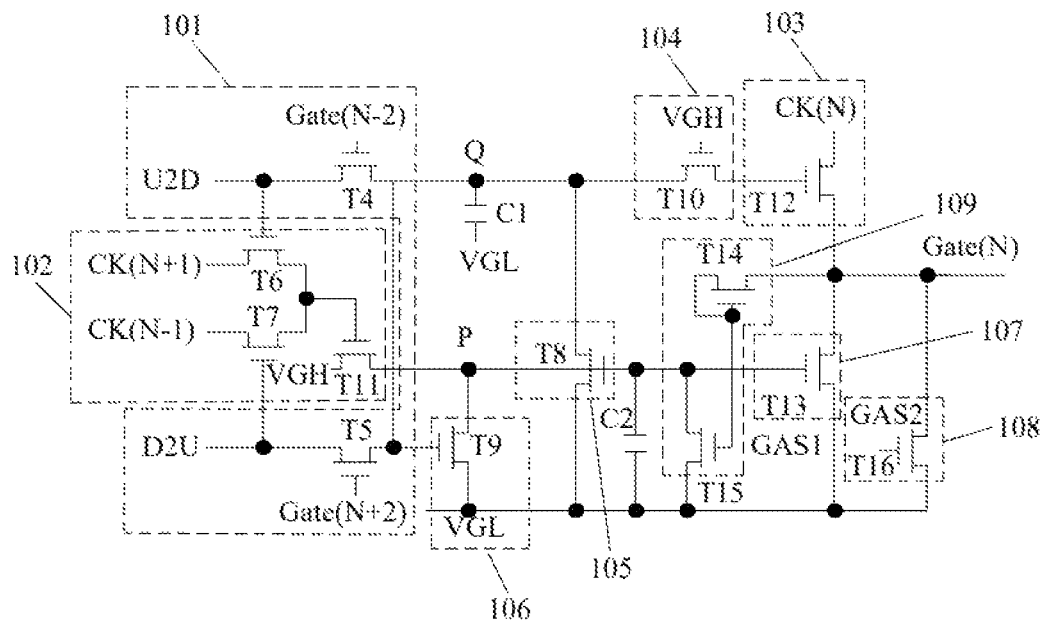
FIG. 3 is an Nth stage gate driving unit provided by an embodiment of the application.

In one of the embodiments, as shown in FIG. 3, FIG. 3 is an Nth stage gate driving unit provided by an embodiment of the application. The Nth stage gate driving unit 110 comprises a forward and backward scan control module 101, a node signal control module 102, an output control module 103, a voltage stabilizing module 104, a first pull-down module 105, a second pull-down module 106, a third pull-down module 107, a fourth pull-down module 108, a pull-up module 109, a first capacitor C1 and a second capacitor C2, and N≥1.

The forward and backward scan control module 110 is configured to control the Nth stage gate driving unit to perform forward scan or backward scan according to a forward scan control signal U2D or a backward scan control signal D2U.

The forward and backward scan control module 110 comprise a fourth thin film transistor T4 and a fifth thin film transistor T5. The source of the fourth thin film transistor T4 receives the forward scan control signal U2D, and the drain is connected to the first node Q. When N is equal to 1, the gate of the fourth thin film transistor T4 is connected to the first start signal STV1. When N is equal to 2, the gate of the fourth thin film transistor T4 is connected to the second start signal STV2. When N is greater than or equal to 3, the gate of the fourth thin film transistor T4 is connected to the (N−2)th stage gate driving signal Gate(N−2). The source of the fifth thin film transistor T5 receives the backward scan control signal D2U, and the drain is connected to the first node Q, and the gate receives the (N+2)th stage gate driving signal Gate(N+2).

The node signal control module 102 is employed to control the current stage gate driving unit to output a low potential gate driving signal in the non-working phase according to the (N+1)th stage clock signal CK(N+1) and the (N−1)th stage clock signal CK(N−1).

The node signal control module 102 comprises a sixth thin film transistor T6, a seventh thin film transistor T7 and an eleventh thin film transistor T11. The source of the sixth thin film transistor T6 receives the (N+1)th stage clock signal CK(N+1), and the drain of the sixth thin film transistor T6 is connected to the drain of the seventh thin film transistor T7 and the gate of the eleventh thin film transistor T11, and the gate of the sixth thin film transistor T6 receives the forward scan control signal U2D. The drain of the seventh thin film transistor T7 receives the (N−1)th stage clock signal CK(N−1), and the gate of the seventh thin film transistor T7 receives the backward scan signal D2U. The source of the eleventh thin film transistor T11 receives the constant voltage high potential signal VGH, and the drain of the eleventh thin film transistor T11 is connected to the second node P.

The output control module 103 is employed for controlling the output of the current stage gate driving signal according to the current stage clock signal (i.e. the Nth clock signal CK(N)), and the voltage stabilizing module 104 is employed for maintaining the potential of the first node Q.

The output control module 103 comprises a twelfth thin film transistor T12, and the voltage stabilizing module 104 comprises a tenth thin film transistor T10. The source of the tenth thin film transistor T10 is connected to the first node Q, and the drain of the tenth thin film transistor T10 is connected to the gate of the twelfth thin film transistor T12, and the gate of the tenth thin film transistor T10 receives the constant voltage high potential signal VGH. The source of the twelfth thin film transistor receives the Nth stage clock signal CK(N).

The first pull-down module 105 is configured to pull down the potential of a first node Q. The first pull-down module 105 comprises an eighth thin film transistor T8. The source of the eighth thin film transistor T8 is connected to the first node Q, and the drain of the eighth thin film transistor T8 receives the constant voltage low potential signal VGL, and the gate of the eighth thin film transistor T8 is connected to the second node P.

The second pull-down module 106 is configured to pull down a potential of a second node P. The second pull-down module 106 comprise a ninth thin film transistor T9. The source of the ninth thin film transistor T9 is connected to the second node P, and the ninth thin film transistor T9 receives the constant voltage low potential signal VGL, and the gate of the ninth thin film transistor T9 is connected to the drain of the fifth thin film transistor T5.

The third pull-down module 107 is configured to pull down a potential of the current stage gate driving signal Gate(N). The third pull-down module 107 comprises a thirteenth thin film transistor T13. The gate of the thirteenth thin film transistor T13 is connected to the second node P, and the drain of the thirteenth thin film transistor T13 receives the constant voltage low potential signal VGL.

The fourth pull-down module 108 is configured to pull down the level of the current stage gate drive signal Gate(N) when the display panel is in a second working state according to a second global signal GAS2. The fourth pull-down module 108 comprises a sixteenth thin film transistor T16.

The gate of the sixteenth thin film transistor T16 receives the second global signal GAS2, and the drain of the sixteenth thin film transistor T16 receives the constant voltage low potential signal VGL.

The pull-up module 109 is configured to control the current stage GOA unit to output a gate driving signal of a high potential when the display panel is in a first working state according to a first global signal GAS1. The pull-up module 109 comprises a fourteenth thin film transistor T14 and a fifteenth thin film transistor T15. The source and the gate of the fourteenth thin film transistor T14 are both connected to the gate of the fifteenth thin film transistor T15, and the gate of the fifteenth thin film transistor T15 receives the first global signal GAS1. The drain of the fourteenth thin film transistor T14 is connected to the drain of the twelfth thin film transistor T12, the drain of the thirteenth thin film transistor T13 and the drain of the sixteenth thin film transistor T16. The source of the fifteenth thin film transistor T15 is connected to the second node P, and the drain of the fifteenth thin film transistor T15 receives the constant voltage low potential signal VGL.

One terminal of the first capacitor C1 is connected to the first node Q, and the other terminal is connected to the constant voltage low potential signal VGL. One terminal of the second capacitor is connected to the second node P, and the other terminal is connected to the constant voltage low potential signal VGL.

Specifically, the first working state is a state of black screen touch operation or abnormal power failure. It can be understood that when the display panel is in the first working state, the first global signal GAS1 is at a high potential, and all GOA units output gate driving signals of a high potential. The second working state is a state in display touch operation period when the second global signal GAS2 is at a high potential.

It should be noted that the circuit structure of the gate driving units of the other stages is the same as the circuit structure of the Nth stage gate driving unit, and will not be repeated here.

Figure 4:
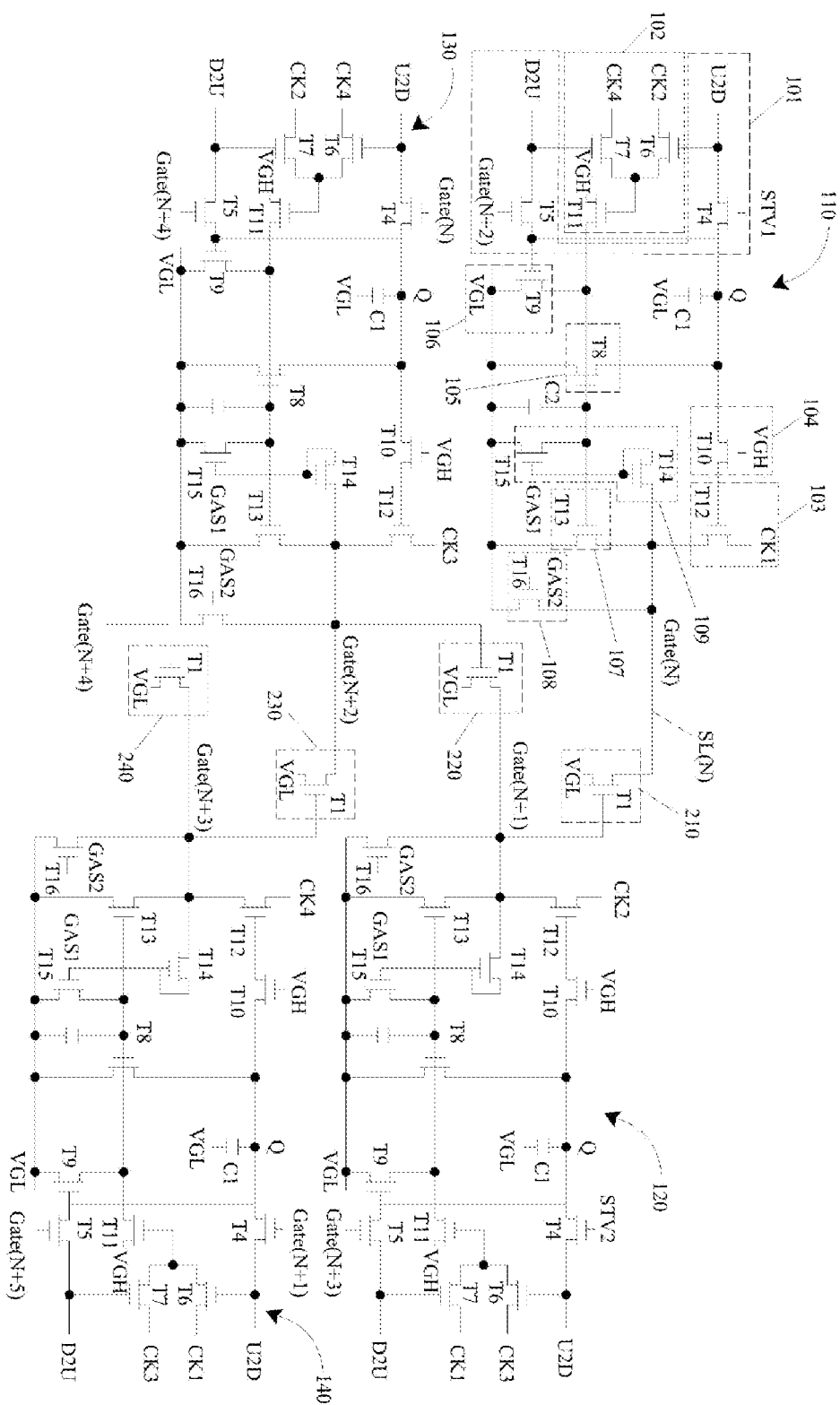
FIG. 4 is a circuit structural diagram of a gate driving unit and an auxiliary driving unit provided by an embodiment of the application.

Furthermore, the first auxiliary driving unit comprises a first thin film transistor T1. As shown in FIG. 4, FIG. 4 is a circuit structural diagram of a gate driving unit and an auxiliary driving unit provided by an embodiment of the application. FIG. 4 only illustrates the connection relationship between the Nth stage gate driving unit 110 to the (N+3)th stage gate driving unit 140 and the Nth stage auxiliary driving unit 210 to the (N+3)th stage auxiliary driving unit 240.

The Nth stage first auxiliary driving unit 210 is illustrated. The first auxiliary driving unit 210 comprises the first thin film transistor T1. The first terminal of the Nth scan line SL(N) is connected to the drain of the fourteenth thin film transistor T14 to receive and transmit the Nth stage gate drive signal Gate(N). One of the source and the drain of the first thin film transistor T1 is electrically connected to the second terminal of the Nth scan line SL(N), and the other of the source and the drain of the first thin film transistor T1 is connected to the source driving signal line DDL, and receives the driving source signal. The driving source signal is the constant voltage low potential signal VGL. The gate of the first thin film transistor T1 is electrically connected to the (N+1)th scan line, and the constant voltage low potential signal VGL is employed to rapidly pull down the potential of the Nth stage gate drive signal Gate(N) when the first thin film transistor T1 is activated, thereby reducing the falling delay of the Nth stage gate drive signal Gate(N).

The falling edge of the Nth stage gate drive signal Gate(N) can be at the same timing with the rising edge of the (N+1)th stage gate drive signal Gate(N+1). Alternately, the rising edge of the (N+1)th stage gate drive signal Gate(N+1) lags the falling edge of the Nth stage gate drive signal Gate(N). The first thin film transistor is an N-channel thin film transistor T1, and the driving source signal transmitted by the driving source signal line DDL is the constant voltage low potential signal VGL.

When the Nth stage gate driving signal starts the falling edge, the (N+1)th stage gate driving signal G(N+1) starts the rising edge. At this time, the first thin film transistor T1 in the Nth stage first auxiliary driving unit 210 controlled by the (N+1)th stage gate driving signal G(N+1) is activated, and the Nth stage first auxiliary driving unit 210 outputs the driving source signal to the Nth scan line. Accordingly, the Nth stage gate drive signal Gate(N) transmitted by the Nth scan line drops rapidly, thereby reducing the transmission delay of the gate driving signal far away from the Nth stage gate driving unit 110 in the Nth scan line.

In the (N+1)th stage first auxiliary driving unit 210, one of the source and the drain of the first driving thin film transistor T1 is connected to the (N+1)th scan line, and the other of the source and the drain of the first thin film transistor T1 is connected to the driving source signal line DDL and receives the driving source signal, and the gate of the first thin film transistor T1 is connected to the (N+2)th scan line. In the (N+2)th stage first auxiliary driving unit 230, one of the source and the drain of the first driving thin film transistor T1 is connected to the (N+2)th scan line, and the other of the source and the drain of the first thin film transistor T1 is connected to the driving source signal line DDL and receives the driving source signal, and the gate of the first thin film transistor T1 is connected to the (N+3)th scan line. In the (N+3)th stage first auxiliary driving unit 240, one of the source and the drain of the first driving thin film transistor T1 is connected to the (N+3)th scan line, and the other of the source and the drain of the first thin film transistor T1 is connected to the driving source signal line DDL and receives the driving source signal, and the gate of the first thin film transistor T1 is connected to the (N+4)th scan line.

Specifically, in the aforesaid embodiment, only the circuit structure and the working logic of the Nth stage first auxiliary driving unit 210 are illustrated for description. The circuit structure of each cascaded first auxiliary driving unit in the display panel is the same as the circuit structure of the Nth stage first auxiliary driving unit 210, and will not be repeated here.

In the embodiment of the present application, the display panel is of a 4CK architecture, and the loop is performed with two gate driving units as the minimum repeating unit. As shown in FIG. 4, the Nth stage gate driving unit 110 and the (N+1)th stage gate driving unit 120 may constitute a gate driving repeating unit.

As shown in FIG. 4, there are a total of four clock signals CK in the gate driving unit of the display panel, which are the first clock signal CK1 to the fourth clock signal CK4. When the current stage clock signal CK(N) of the Nth stage gate driving unit 110 is the first clock signal CK1, the next stage clock signal of the Nth stage gate driving unit 110 is the second clock signal CK2, and the previous stage clock signal of the Nth stage gate driving unit 110 is the fourth clock signal CK4; when the current stage clock signal of the (N+2)th stage gate driving unit 130 is the first clock signal CK3, the next stage clock signal of the (N+2)th stage gate driving unit 130 is the fourth clock signal CK4, and the previous stage clock signal of the (N+2)th stage gate driving unit 130 is the first clock signal CK1.

It is understandable that if the node signal control module 102 of the Nth gate driving unit 110 is correspondingly to receive the second clock signal CK2 and the fourth clock signal CK4, the output control module 103 receives the first clock signal CK1. Then, the node signal control module 102 of the (N+1)th gate driving unit 120 receives the first clock signal CK1 and the third clock signal CK3, and the output control module 103 receives the second clock signal CK2. Certainly, the display panel can also have a 8CK architecture, the GOA circuit loops with four basic units as the smallest repeating unit.

In one of the embodiments, the type of the first thin film transistor T1 is not limited to an N-channel type thin film transistor, and the first thin film transistor T1 may also be a P-channel type thin film transistor. When the first thin film transistor T1 is a P-channel thin film transistor, the driving source signal may be a constant voltage high potential signal, or the driving source signal may also be an AC signal, and when the first thin film transistor T1 is activated, the driving source signal is a high potential signal.

Figure 5:
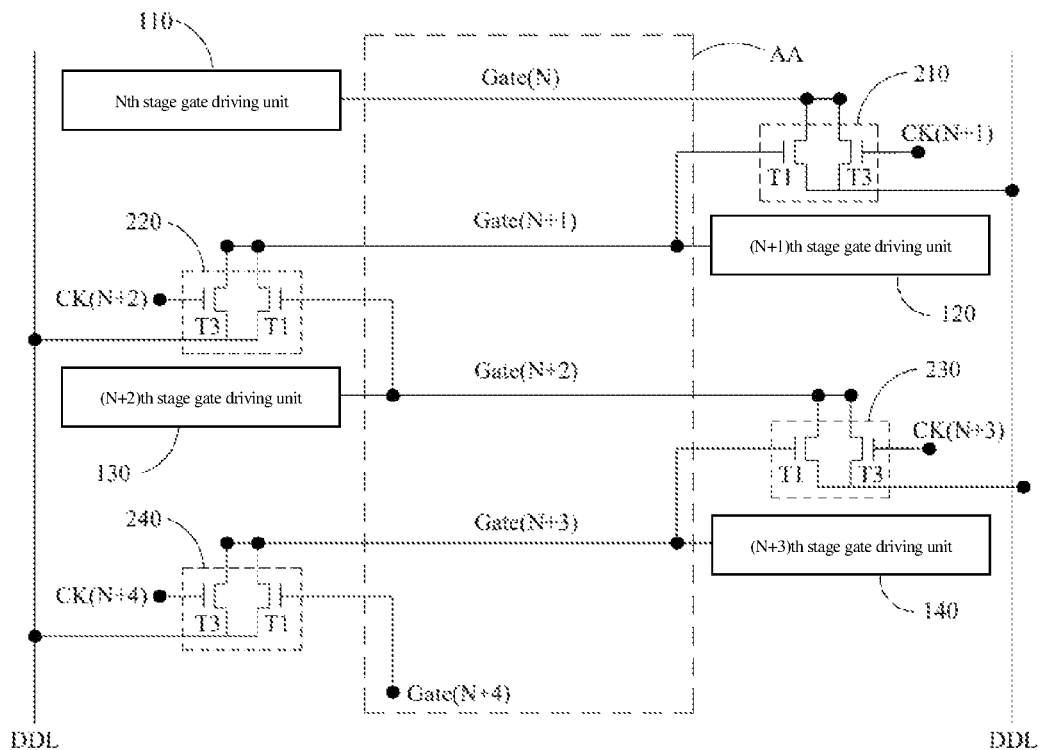
FIG. 5 is a structural diagram of a second display panel provided by an embodiment of the application.

In one of the embodiments, as shown in FIG. 5, FIG. 5 is a structural diagram of a second display panel provided by an embodiment of the application. Each of the first auxiliary driving units comprises a first thin film transistor T1 and a third thin film transistor T3.

The Nth stage first auxiliary driving unit 210 is illustrated. The first auxiliary driving unit 210 comprises a first thin film transistor T1 and a third thin film transistor T3. One of the source and the drain of the first thin film transistor T1 is connected to the second terminal of the Nth scan line, and the other of the source and the drain of the first thin film transistor T1 is connected to the driving source signal line DDL and receives the driving source signal, and the gate of the first thin film transistor T1 is connected to the (N+1)th scan line. One of the source and the drain of the third thin film transistor T3 is connected to the second terminal of the Nth scan line, and the other of the source and the drain of the third thin film transistor T3 is connected to the driving source signal line DDL and receives the driving source signal, and the gate of the third thin film transistor T3 receives the (N+1)th stage output clock signal CK(N+1) corresponding to the (N+1)th stage gate driving unit. The type of the third thin film transistor T3 is the same as the type of the first thin film transistor T1, and both are N-channel thin film transistors, and the driving source signal transmitted by the driving source signal line DDL is the constant voltage low potential signal VGL. Under the control of the (N+1)th stage output clock signal CK(N+1), the potential of the Nth stage gate driving signal Gate(N) transmitted by the Nth scan line can be periodically pulled down to maintain the stability of the Nth stage gate driving signal Gate(N).

In the (N+1)th stage first auxiliary driving unit 210, one of the source and the drain of the first driving thin film transistor T1 is connected to the (N+1)th scan line, and the other of the source and the drain of the first thin film transistor T1 is connected to the driving source signal line DDL and receives the driving source signal, and the gate of the first thin film transistor T1 is connected to the (N+2)th scan line. One of the source and the drain of the third thin film transistor T3 is connected to the second terminal of the (N+1)th scan line, and the other of the source and the drain of the third thin film transistor T3 is connected to the driving source signal line DDL and receives the driving source signal, and the gate of the third thin film transistor T3 receives the (N+2)th stage output clock signal CK(N+2).

In the (N+2)th stage first auxiliary driving unit 230, one of the source and the drain of the first driving thin film transistor T1 is connected to the (N+2)th scan line, and the other of the source and the drain of the first thin film transistor T1 is connected to the driving source signal line DDL and receives the driving source signal, and the gate of the first thin film transistor T1 is connected to the (N+3)th scan line. One of the source and the drain of the third thin film transistor T3 is connected to the second terminal of the (N+2)th scan line, and the other of the source and the drain of the third thin film transistor T3 is connected to the driving source signal line DDL and receives the driving source signal, and the gate of the third thin film transistor T3 receives the (N+3)th stage output clock signal CK(N+3).

In the (N+3)th stage first auxiliary driving unit 240, one of the source and the drain of the first driving thin film transistor T1 is connected to the (N+3)th scan line, and the other of the source and the drain of the first thin film transistor T1 is connected to the driving source signal line DDL and receives the driving source signal, and the gate of the first thin film transistor T1 is connected to the (N+4)th scan line. One of the source and the drain of the third thin film transistor T3 is connected to the second terminal of the (N+3)th scan line, and the other of the source and the drain of the third thin film transistor T3 is connected to the driving source signal line DDL and receives the driving source signal, and the gate of the third thin film transistor T3 receives the (N+4)th stage output clock signal CK(N+4).

Specifically, in the aforesaid embodiment, only the circuit structure and the working logic of the Nth stage first auxiliary driving unit 210 are illustrated for description. The circuit structure of each cascaded first auxiliary driving unit in the display panel is the same as the circuit structure of the Nth stage first auxiliary driving unit 210, and will not be repeated here. The circuit structure of the first auxiliary driving unit in the second display panel described in FIG. 5 is also applicable to the circuit structures of the first auxiliary driving unit and the second auxiliary driving unit in the display panel in FIGS. 6 to 8. In addition, the circuit structure of the gate driving unit of each stage shown in FIG. 3 is also applicable to the circuit structure of the gate driving unit of each stage shown in FIG. 5, and will not be repeated here.

The first thin film transistor T1 is a N-channel thin film transistor. The driving source signal may be a constant voltage low potential signal, or may also be an AC signal, and when the first thin film transistor T1 is activated, the driving source signal is a low potential signal.

Figure 6:
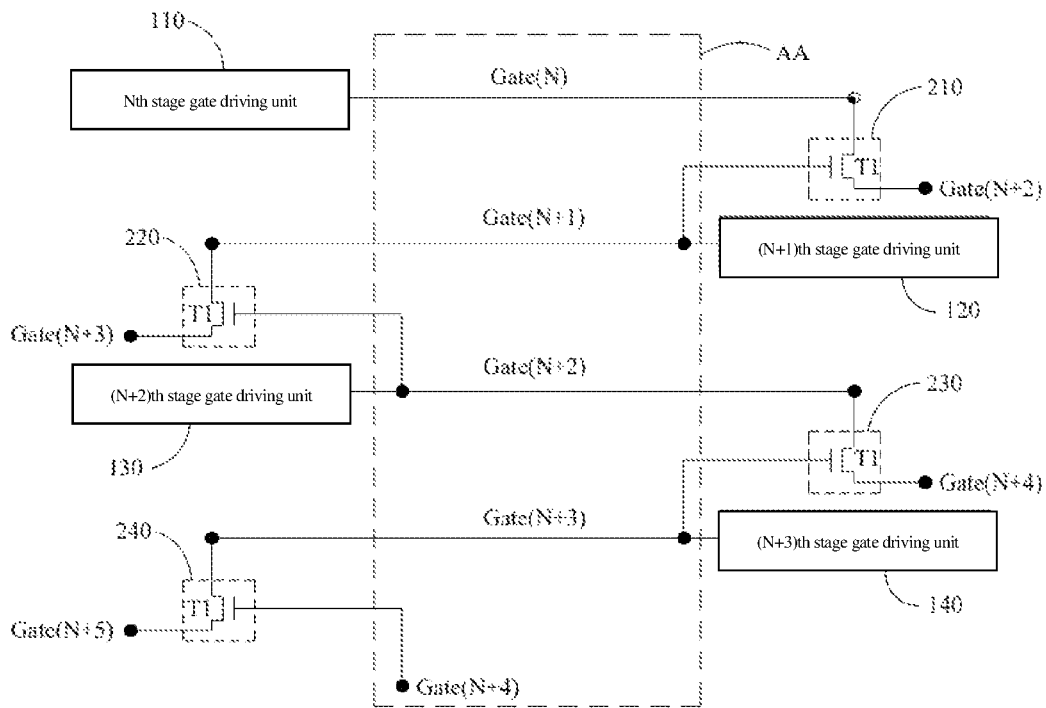
FIG. 6 is a structural diagram of a third display panel provided by an embodiment of the application.

In one of the embodiments, as shown in FIG. 6, FIG. 6 is a structural diagram of a third display panel provided by an embodiment of the application. The display panel may comprise an Nth stage gate driving unit 110, an (N+1)th stage gate driving unit 120, an (N+2)th stage gate driving unit 130 and an (N+3)th stage gate driving unit 140, where N is a positive integer and M=1.

In the Nth stage first auxiliary driving unit 210, one of the source and the drain of the first thin film transistor T1 is electrically connected to the second terminal of the Nth scan line, and the other of the source and the drain of the first thin film transistor T1 is connected to the (N+2)th scan line and receives the (N+2)th stage gate driving signal Gate(N+2), and the gate of the first thin film transistor T1 is electrically connected to the (N+1)th scan line. The (N+2)th stage gate driving signal Gate (N+2) is the driving source signal corresponding to the Nth stage first auxiliary driving unit 210.

The falling edge of the Nth stage gate drive signal Gate(N) can be at the same timing with the rising edge of the (N+1)th stage gate drive signal Gate(N+1). Alternately, the rising edge of the (N+1)th stage gate drive signal Gate(N+1) lags the falling edge of the Nth stage gate drive signal Gate(N). The falling edge of the (N+1)th stage gate drive signal Gate(N+1) can be at the same timing with the rising edge of the (N+2)th stage gate drive signal Gate(N+2). Alternately, the rising edge of the (N+2)th stage gate drive signal Gate(N+2) lags the falling edge of the (N+1)th stage gate drive signal Gate(N+1).

In the (N+1)th stage first auxiliary driving unit 220, one of the source and the drain of the first thin film transistor T1 is electrically connected to the second terminal of the (N+1)th scan line, and the other of the source and the drain of the first thin film transistor T1 is connected to the (N+3)th scan line and receives the (N+3)th stage gate driving signal Gate(N+3), and the gate of the first thin film transistor T1 is electrically connected to the (N+2)th scan line. The (N+3)th stage gate driving signal Gate (N+3) is the driving source signal corresponding to the (N+1)th stage first auxiliary driving unit 220.

In the (N+2)th stage first auxiliary driving unit 230, one of the source and the drain of the first thin film transistor T1 is electrically connected to the second terminal of the (N+2)th scan line, and the other of the source and the drain of the first thin film transistor T1 is connected to the (N+4)th scan line and receives the (N+4)th stage gate driving signal Gate(N+4), and the gate of the first thin film transistor T1 is electrically connected to the (N+3)th scan line. The (N+4)th stage gate driving signal Gate (N+4) is the driving source signal corresponding to the (N+2)th stage first auxiliary driving unit 230.

In the (N+3)th stage first auxiliary driving unit 240, one of the source and the drain of the first thin film transistor T1 is electrically connected to the second terminal of the (N+3)th scan line, and the other of the source and the drain of the first thin film transistor T1 is connected to the (N+5)th scan line and receives the (N+5)th stage gate driving signal Gate(N+5), and the gate of the first thin film transistor T1 is electrically connected to the (N+4)th scan line. The (N+5)th stage gate driving signal Gate (N+5) is the driving source signal corresponding to the (N+3)th stage first auxiliary driving unit 240.

Figure 7:
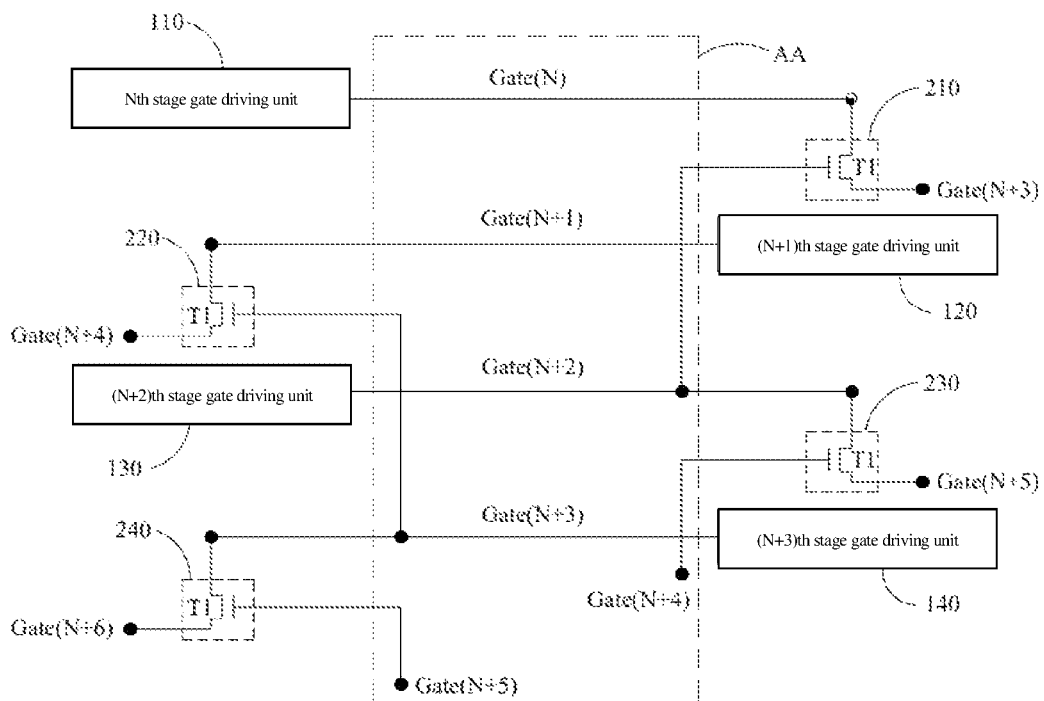
FIG. 7 is a structural diagram of a fourth display panel provided by an embodiment of the application.

In one of the embodiments, as shown in FIG. 7, FIG. 7 is a structural diagram of a fourth display panel provided by an embodiment of the application. The display panel may comprise an Nth stage gate driving unit 110, an (N+1)th stage gate driving unit 120, an (N+2)th stage gate driving unit 130 and an (N+3)th stage gate driving unit 140, where N is a positive integer and M=2.

In the Nth stage first auxiliary driving unit 210, one of the source and the drain of the first thin film transistor T1 is electrically connected to the second terminal of the Nth scan line, and the other of the source and the drain of the first thin film transistor T1 is connected to the (N+3)th scan line and receives the (N+3)th stage gate driving signal Gate(N+3), and the gate of the first thin film transistor T1 is electrically connected to the (N+2)th scan line. The (N+3)th stage gate driving signal Gate (N+3) is the driving source signal corresponding to the Nth stage first auxiliary driving unit 210.

The falling edge of the Nth stage gate drive signal Gate(N) can be at the same timing with the rising edge of the (N+2)th stage gate drive signal Gate(N+2). Alternately, the rising edge of the (N+2)th stage gate drive signal Gate(N+2) lags the falling edge of the Nth stage gate drive signal Gate(N). When the Nth stage gate driving signal Gate(N) starts the falling edge, the (N+3)th stage gate driving signal Gate(N+3) is a low potential signal.

In the (N+1)th stage first auxiliary driving unit 220, one of the source and the drain of the first thin film transistor T1 is electrically connected to the second terminal of the (N+1)th scan line, and the other of the source and the drain of the first thin film transistor T1 is connected to the (N+4)th scan line and receives the (N+4)th stage gate driving signal Gate(N+4), and the gate of the first thin film transistor T1 is electrically connected to the (N+3)th scan line. The (N+4)th stage gate driving signal Gate (N+4) is the driving source signal corresponding to the (N+1)th stage first auxiliary driving unit 220.

In the (N+2)th stage first auxiliary driving unit 230, one of the source and the drain of the first thin film transistor T1 is electrically connected to the second terminal of the (N+2)th scan line, and the other of the source and the drain of the first thin film transistor T1 is connected to the (N+5)th scan line and receives the (N+5)th stage gate driving signal Gate(N+5), and the gate of the first thin film transistor T1 is electrically connected to the (N+4)th scan line. The (N+5)th stage gate driving signal Gate (N+5) is the driving source signal corresponding to the (N+2)th stage first auxiliary driving unit 230.

In the (N+3)th stage first auxiliary driving unit 240, one of the source and the drain of the first thin film transistor T1 is electrically connected to the second terminal of the (N+3)th scan line, and the other of the source and the drain of the first thin film transistor T1 is connected to the (N+6)th scan line and receives the (N+6)th stage gate driving signal Gate(N+6), and the gate of the first thin film transistor T1 is electrically connected to the (N+5)th scan line. The (N+6)th stage gate driving signal Gate (N+6) is the driving source signal corresponding to the (N+3)th stage first auxiliary driving unit 240.

Specifically, in the aforesaid embodiment, only the circuit structure and the working logic of the Nth stage first auxiliary driving unit 210 are illustrated for description. The circuit structure of each cascaded first auxiliary driving unit in the display panel is the same as the circuit structure of the Nth stage first auxiliary driving unit 210, and will not be repeated here.

In practical applications, when M=1, the source driving signal corresponding to the Nth stage first auxiliary driving unit 210 may be the (N+2)th stage gate driving signal Gate(N+2) transmitted by the (N+2)th scan line, the (N+3)th stage gate driving signal Gate(N+3) transmitted by the (N+3)th scan line, . . . and the (N+X)th stage gate driving signal Gate(N+X), wherein X is a positive integer greater than or equal to M+1.

When M=2, the source driving signal corresponding to the Nth stage first auxiliary driving unit 210 may be the Nth stage gate driving signal Gate(N), the (N+3)th stage gate driving signal Gate(N+3), . . . and the (N+X)th stage gate driving signal Gate(N+X), wherein X is equal to 0, or a positive integer greater than or equal to M+1.

Specifically, the circuit structure of the gate driving unit of each stage shown in FIG. 3 is also applicable to the circuit structure of the gate driving unit of each stage shown in FIG. 6 and FIG. 7, and will not be repeated here.

In one of the embodiments, the display panel further comprises at least one set of second auxiliary driving units arranged in the active area, and each set of the second auxiliary driving units possesses a plurality of second auxiliary driving units, which are cascaded, and at least one connection node is provided between the first terminal and the second terminal of the Nth scan line. An output terminal of the Nth stage second auxiliary driving unit is electrically connected to the connection node of the Nth scan line, and an input terminal of the Nth stage second auxiliary driving unit is electrically connected to the driving source signal line, and a control terminal of the Nth stage second auxiliary driving unit is electrically connected to the (N+M)th scan line.

Figure 8:
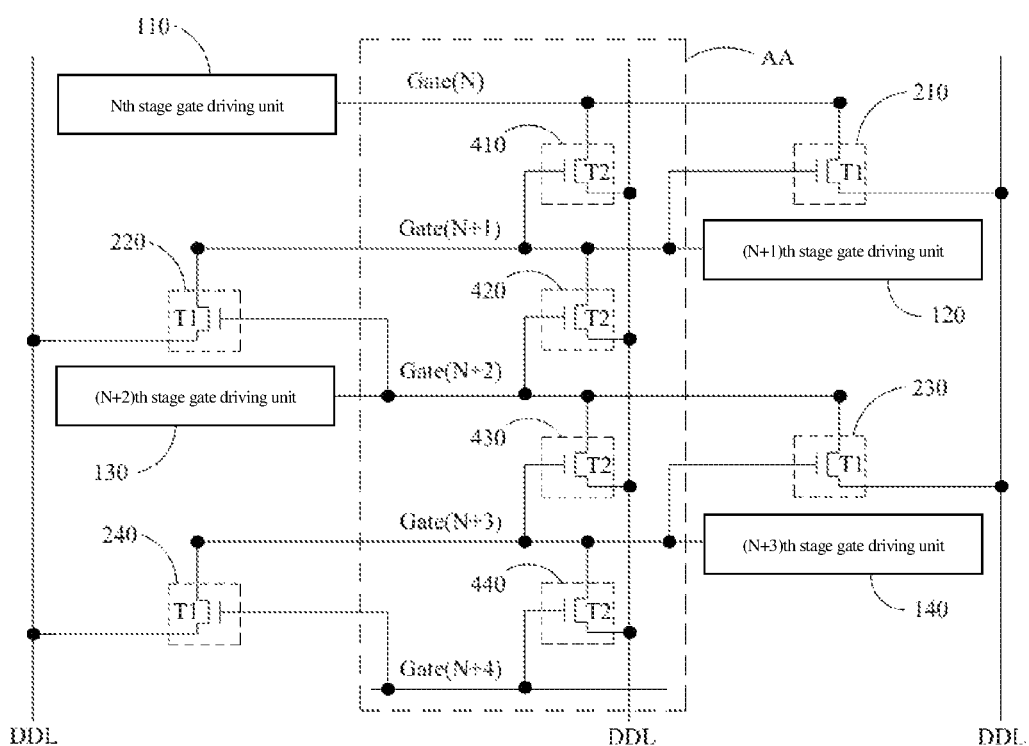
FIG. 8 is a structural diagram of a fifth display panel provided by an embodiment of the application.

As shown in FIG. 8, FIG. 8 is a structural diagram of a fifth display panel provided by an embodiment of the application. The structure of the fifth display panel shown in FIG. 8 is substantially the same as that of the first display panel shown in FIG. 2. The difference is that the display panel shown in FIG. 8 further comprises a set of second auxiliary driving units arranged in the active area. The set of second auxiliary driving units comprises an Nth stage second auxiliary driving unit 410, an (N+1)th stage second auxiliary driving unit 420, an (N+2)th stage second auxiliary driving unit 430 and an (N+3)th stage second auxiliary driving unit 440.

The Nth stage second auxiliary driving unit 410 is illustrated. The Nth scan line possesses a connection node arranged between the first terminal and the second terminal. The output terminal of the Nth stage second auxiliary driving unit 410 is electrically connected to the connection node of the Nth scan line, and the input terminal of the Nth stage second auxiliary driving unit 410 is electrically connected to the driving source signal line DDL, and receives the driving source signal, and the control terminal of the Nth stage second auxiliary driving unit 410 is electrically connected to the (N+1)th scan line.

Furthermore, the circuit structure of the second auxiliary driving unit is the same as the circuit structure of the first auxiliary driving unit 200.

The Nth stage second auxiliary driving unit 410 is illustrated. The Nth stage second auxiliary driving unit comprises a second thin film transistor T2. One of the source and the drain of the second thin film transistor T2 is electrically connected to the connection node of the Nth scan line, and the other of the source and the drain of the second thin film transistor T2 is connected to the driving source signal line DDL and receives the driving source signal, and the gate of the second thin film transistor T2 is electrically connected to the (N+1)th scan line.

When the Nth stage gate driving signal starts the falling edge, the (N+1)th stage gate driving signal G(N+1) starts the rising edge. At this time, the second thin film transistor T2 in the Nth stage second auxiliary driving unit 410 controlled by the (N+1)th stage gate driving signal G(N+1) is activated, and the Nth stage second auxiliary driving unit 410 outputs the driving source signal to the Nth scan line. Accordingly, the Nth stage gate drive signal Gate(N) transmitted by the Nth scan line drops rapidly, thereby reducing the transmission delay of the gate driving signal far away from the Nth stage gate driving unit 110 in the Nth scan line.

The output terminal of the (N+1)th stage second auxiliary driving unit 420 is electrically connected to the connection node of the (N+1)th scan line, and the input terminal of the (N+1)th stage second auxiliary driving unit 420 is electrically connected to the driving source signal line DDL and receives the driving source signal, and the control terminal of the (N+1)th stage second auxiliary driving unit 420 is electrically connected to the (N+2)th scan line.

The output terminal of the (N+2)th stage second auxiliary driving unit 430 is electrically connected to the connection node of the (N+2)th scan line, and the input terminal of the (N+2)th stage second auxiliary driving unit 430 is electrically connected to the driving source signal line DDL and receives the driving source signal, and the control terminal of the (N+2)th stage second auxiliary driving unit 430 is electrically connected to the (N+3)th scan line.

The output terminal of the (N+3)th stage second auxiliary driving unit 440 is electrically connected to the connection node of the (N+3)th scan line, and the input terminal of the (N+3)th stage second auxiliary driving unit 440 is electrically connected to the driving source signal line DDL and receives the driving source signal, and the control terminal of the (N+3)th stage second auxiliary driving unit 440 is electrically connected to the (N+4)th scan line.

Specifically, in the aforesaid embodiment, only the circuit structure and the working logic of the Nth stage first auxiliary driving unit 210 are illustrated for description. The circuit structure of each cascaded first auxiliary driving unit in the display panel is the same as the circuit structure of the Nth stage first auxiliary driving unit 210. Meanwhile, in the embodiment of the present application, the circuit structure of the gate driving units of each stage is the same as the circuit structure of the gate driving unit shown in FIG. 4, and will not be repeated here.

When the horizontal width of the active area AA is too large in the viewing angle of the front view of the display panel, only the Nth stage first auxiliary driving unit 210 provided in the non-active area NA cannot rapidly pull down the potential of the gate driving signal that is far from the Nth stage first auxiliary driving unit 210. By arranging the Nth stage second auxiliary driving unit 410 in the active area AA, the potential of the gate driving signal Gate(N) in the middle area of the Nth scan line or in other areas located between the first terminal and the second terminal of the Nth scan line can be pulled down to further reduce the transmission delay of the Nth stage gate driving signal Gate(N) in the Nth scan line.

In practical applications, not only a set of a plurality of cascaded second auxiliary driving units can be arranged in the active area AA. For a display panel with a larger horizontal width of the active area AA, two or more cascaded second auxiliary driving units can also be provided, which can further reduce the transmission delay of the gate driving signal.

Furthermore, the display panel further comprises a pixel driving circuit located in the active area AA, and the pixel driving circuit comprises a plurality of thin film transistors. The second thin film transistor T2 and at least one of the thin film transistors in the pixel driving circuit are arranged in the same layer, so that the second thin film transistor T2 can be prepared and formed at the same time by the manufacturing process of the pixel driving circuit, avoiding the increase of the complexity of the manufacturing process.

Figure 9:
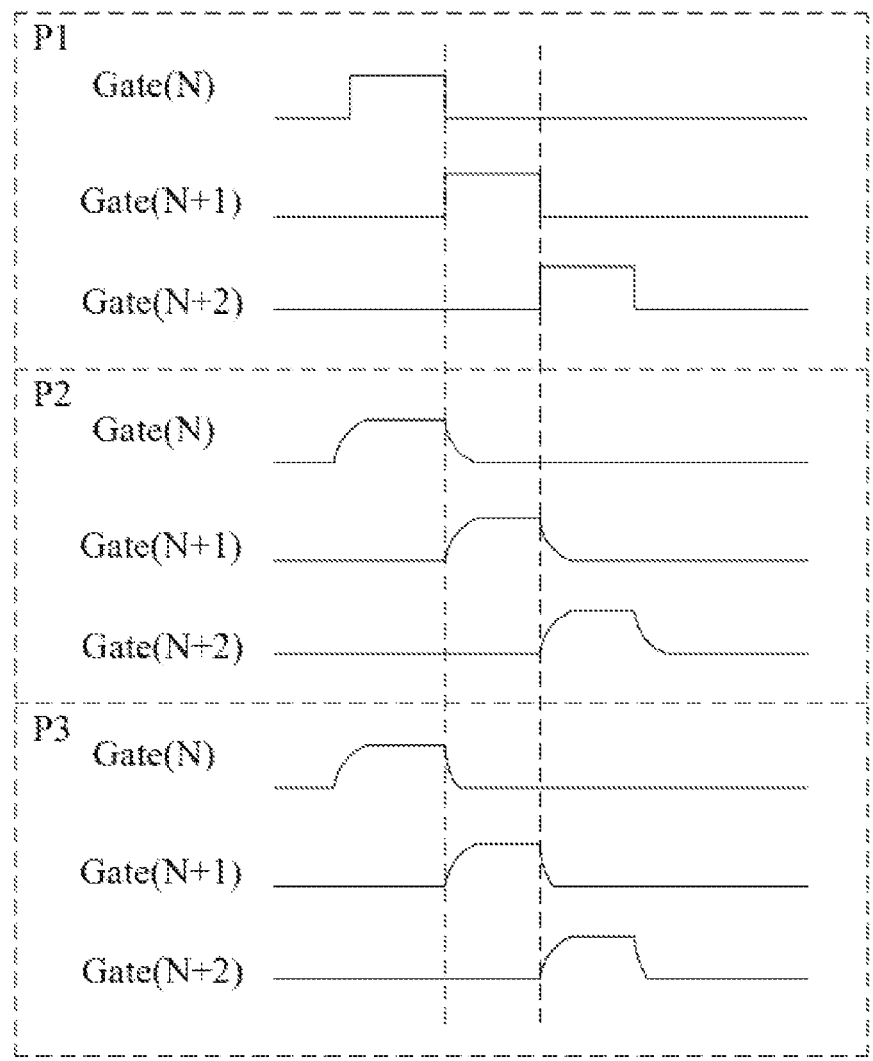
FIG. 9 is a timing diagram of gate driving signals provided by an embodiment of the application.

As shown in FIG. 9, FIG. 9 is a timing diagram of gate driving signals provided by an embodiment of the application. P1 is the ideal waveform diagram of the gate driving signal. P2 is the conventional waveform diagram of the gate driving signal. P3 is the waveform diagram of the improved gate driving signal in the embodiment of the present application. In the ideal waveform diagram P1, the conventional waveform diagram P2 and the improved waveform diagram P3, the waveforms of the Nth stage gate driving signal Gate(N), the (N+1)th stage gate driving signal Gate(N+1) and the (N+2)th stage gate driving signal Gate(N+2) are respectively provided.

In the ideal waveform diagram P1, the rising edges or the falling edges of the Nth stage gate driving signal Gate(N), the (N+1)th stage gate driving signal Gate(N+1) and the (N+2)th stage gate driving signal Gate(N+2) are all linear, or both the rising edges or the falling edges occur at the same timing. This kind of waveform is an ideal waveform required by the display panel, but due to the influence of capacitive reactance and/or impedance, there will always be a certain delay.

Comparing the conventional waveform diagram P2 with the improved waveform diagram P3, it can be seen that the falling edges of the Nth stage gate driving signal Gate(N), the (N+1)th stage gate driving signal Gate(N+1) and the (N+2)th stage gate driving signal Gate(N+2) in the conventional waveform diagram P2 take a longer time before being pulled down to a low potential than the falling edges of the Nth stage gate driving signal Gate(N), the (N+1)th stage gate driving signal Gate(N+1) and the (N+2)th stage gate driving signal Gate(N+2) in the improved waveform diagram P3, correspondingly. In other words, the aforesaid embodiment can make the falling edge of the gate driving signal pull down rapidly, which has improved the delay caused by the capacitive reactance and/or impedance of the driving signal in the active area AA.

Figure 10:
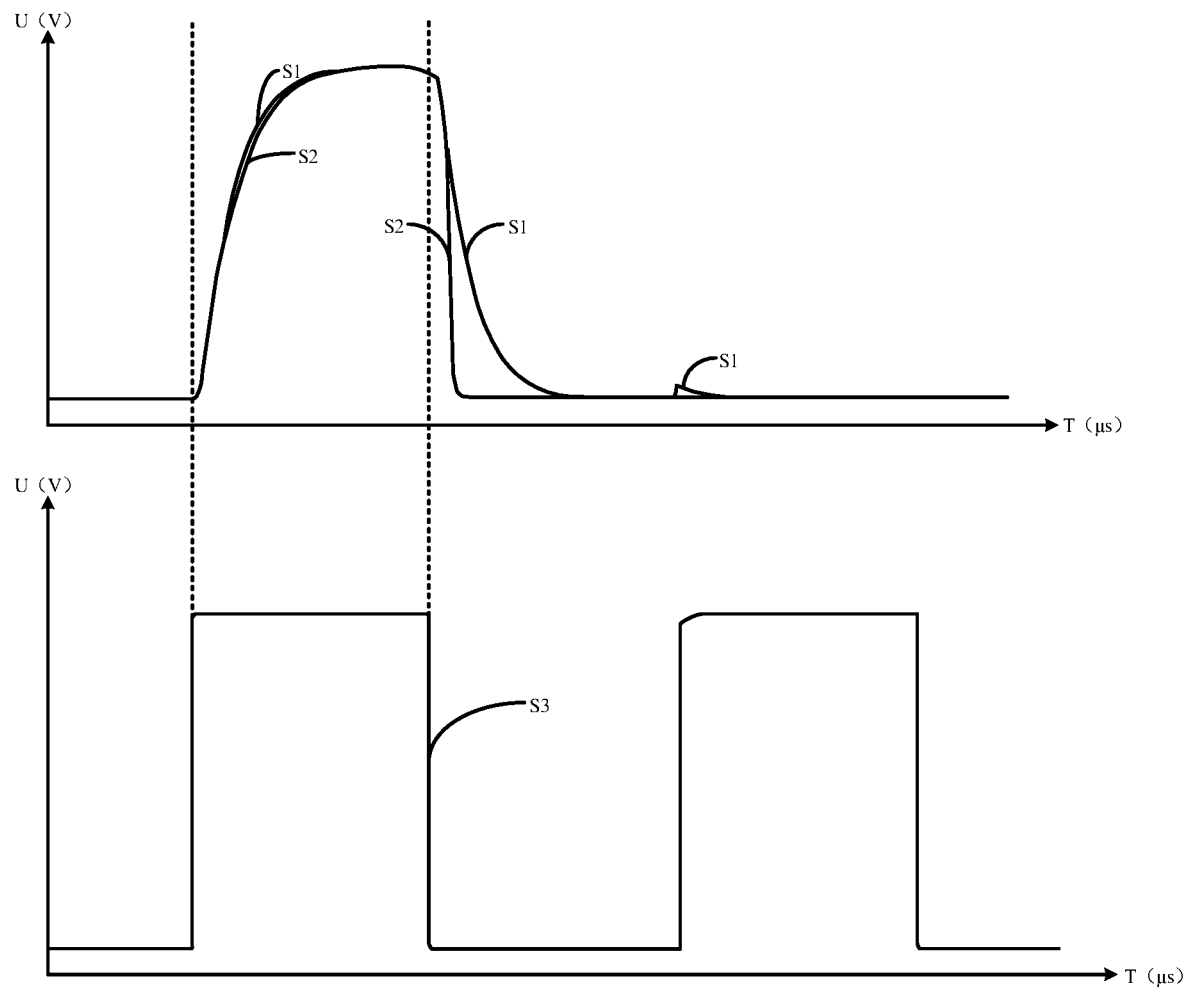
FIG. 10 is a simulation comparison diagram of an improved gate driving signal provided by an embodiment of the application and a conventional gate driving signal.

As shown in FIG. 10, FIG. 10 is a simulation comparison diagram of an improved gate driving signal provided by an embodiment of the application and a conventional gate driving signal. The gate driving signal S1 is the gate driving signal in the conventional technical solution, the gate driving signal S2 is the driving signal in the foregoing embodiment, and the gate driving signal S3 is the gate driving signal in the more ideal state; the horizontal axis can be expressed as time T, and the unit can be microseconds (μs), and the vertical axis can be expressed as the voltage value U, and the unit can be volts (V).

The rising speed of the rising edge of the gate driving signal S3 is significantly higher than the rising speed of the rising edge of the gate driving signal S1 and the rising speed of the rising edge of the gate driving signal S2. However, the rising speed of the rising edge of the gate driving signal S1 is close to or similar to the rising speed of the rising edge of the gate driving signal S2. The falling speed of the falling edge of the gate driving signal S3 is significantly higher than the falling speed of the falling edge of the gate driving signal S1 and the falling speed of the falling edge of the gate driving signal S2; however, the falling speed of the falling edge of the gate driving signal S1 is significantly higher than the falling speed of the falling edge of the gate driving signal S2; meanwhile, in some possible scenario, since the low potential state of the gate driving signal S1 is not subjected to the continuous pull-down action of the first auxiliary driving unit, some potential states slightly higher than the low potential state will easily appear, which will worsen the waveform of the gate driving signal S1, thus affecting the stability of the display panel.

The benefits of the embodiment of the present application are: the embodiment of the present application provides a display panel and an electronic device. The electronic device comprises the display panel. The display panel comprises an active area and a non-active area arranged at a periphery of the active area, wherein the display panel further comprises a plurality of cascaded gate driving units, a plurality of cascaded first auxiliary driving units and a plurality of scan lines. The gate driving unit and the first auxiliary driving unit are both arranged in the non-active area, and the scan lines are at least partially arranged in the active area. The Nth stage gate driving unit is electrically connected to a first terminal of the Nth scan line, and an output terminal of the Nth stage first auxiliary driving unit is electrically connected to a second terminal of the Nth scan line, and an input terminal of the Nth stage first auxiliary driving unit receives a driving source signal, and a control terminal of the Nth stage first auxiliary driving unit is electrically connected to a (N+M)th scan line. Thereby, the first auxiliary driving unit rapidly pulls down the falling edge of the scan signal transmitted in the scan line to reduce the delay of the falling edge of the scan line to achieve or approximate the driving effect of GOA dual driving. Thus, the number of gate driving units in the display panel can be reduced, thereby reducing the width of the frame of the display panel and the electronic device.

In summary, although the above preferred embodiments of the present application are disclosed, the foregoing preferred embodiments are not intended to limit the invention, those skilled in the art can make various kinds of alterations and modifications without departing from the spirit and scope of the present application. Thus, the scope of protection of the present application is defined by the scope of the claims.

What is claimed is:

1. A display panel, comprising an active area and a non-active area arranged at a periphery of the active area, wherein the display panel further comprises:
   a plurality of gate driving units, which are cascaded and arranged in the non-active area;
   a plurality of first auxiliary driving units, which are cascaded and arranged in the non-active area;
   a plurality of scan lines at least partially arranged in the active area; and
   wherein the Nth stage gate driving unit is electrically connected to a first terminal of the Nth scan line, and an output terminal of the Nth stage first auxiliary driving unit is electrically connected to a second terminal of the Nth scan line, and an input terminal of the Nth stage first auxiliary driving unit is electrically connected to a driving source signal line, and a control terminal of the Nth stage first auxiliary driving unit is electrically connected to a (N+M)th scan line, and both N and M are positive integers;
   wherein the display panel further comprises at least one set of second auxiliary driving units arranged in the active area, and each set of the second auxiliary driving units possesses a plurality of second auxiliary driving units, which are cascaded, and at least one connection node is provided between the first terminal and the second terminal of the Nth scan line;
   wherein an output terminal of the Nth stage second auxiliary driving unit is electrically connected to the connection node of the Nth scan line, and an input terminal of the Nth stage second auxiliary driving unit is electrically connected to the driving source signal line, and a control terminal of the Nth stage second auxiliary driving unit is electrically connected to the (N+M)th scan line.

2. The display panel according to claim 1, wherein the Nth stage gate driving unit and the (N+1)th stage gate driving unit are respectively arranged on opposite sides of the active area and staggered along a row direction, and the (N+1)th stage gate driving unit and the Nth stage first auxiliary driving unit are arranged on a same side of the active area, and the Nth stage first auxiliary driving unit is arranged on a side of the (N+1)th stage gate driving unit close to the Nth stage gate driving unit in a column direction.

3. The display panel according to claim 1, wherein the first auxiliary driving unit comprises a first thin film transistor;
   wherein in the Nth stage first auxiliary driving unit, one of a source and a drain of the first thin film transistor is electrically connected to the second terminal of the Nth scan line, and an other of the source and the drain of the first thin film transistor is electrically connected to the driving source signal line, and a gate of the first thin film transistor is electrically connected to the (N+M)th scan line.

4. The display panel according to claim 3, wherein the first thin film transistor is an N-channel thin film transistor, and a signal transmitted by the driving source signal line is a constant voltage low potential signal, and the driving source signal line is perpendicular to the plurality of scan lines.

5. The display panel according to claim 3, wherein the first thin film transistor is an N-channel thin film transistor, and the driving source signal line is the (N+X)th scan line;
   wherein X is a positive integer greater than or equal to M+1.

6. The display panel according to claim 3, wherein the second auxiliary driving unit comprises a second thin film transistor;
   wherein in the Nth stage second auxiliary driving unit, one of a source and a drain of the second thin film transistor is electrically connected to the connection node of the Nth scan line, and an other of the source and the drain of the second thin film transistor is electrically connected to the driving source signal line, and a gate of the second thin film transistor is electrically connected to the (N+M)th scan line.

7. The display panel according to claim 6, wherein the second thin film transistor is of a same type as the first thin film transistor.

8. The display panel according to claim 6, wherein the display panel further comprises a pixel driving circuit located in the active area, and the pixel driving circuit comprises a plurality of thin film transistors, and the second thin film transistor is arranged in a same layer as at least one of the thin film transistors in the pixel driving circuit.

9. An electronic device, comprising a display panel, wherein the display panel comprises an active area and a non-active area arranged at a periphery of the active area, and the display panel further comprises:
   a plurality of gate driving units, which are cascaded and arranged in the non-active area;
   a plurality of first auxiliary driving units, which are cascaded and arranged in the non-active area;
   a plurality of scan lines at least partially arranged in the active area; and
   wherein the Nth stage gate driving unit is electrically connected to a first terminal of the Nth scan line, and an output terminal of the Nth stage first auxiliary driving unit is electrically connected to a second terminal of the Nth scan line, and an input terminal of the Nth stage first auxiliary driving unit is electrically connected to a driving source signal line, and a control terminal of the Nth stage first auxiliary driving unit is electrically connected to a (N+M)th scan line, and both N and M are positive integers;
   wherein the display panel further comprises at least one set of second auxiliary driving units arranged in the active area, and each set of the second auxiliary driving units possesses a plurality of second auxiliary driving units, which are cascaded, and at least one connection node is provided between the first terminal and the second terminal of the Nth scan line;
   wherein an output terminal of the Nth stage second auxiliary driving unit is electrically connected to the connection node of the Nth scan line, and an input terminal of the Nth stage second auxiliary driving unit is electrically connected to the driving source signal line, and a control terminal of the Nth stage second auxiliary driving unit is electrically connected to the (N+M)th scan line.

10. The electronic device according to claim 9, wherein the Nth stage gate driving unit and the (N+1)th stage gate driving unit are respectively arranged on opposite sides of the active area and staggered along a row direction, and the (N+1)th stage gate driving unit and the Nth stage first auxiliary driving unit are arranged on a same side of the active area, and the Nth stage first auxiliary driving unit is arranged on a side of the (N+1)th stage gate driving unit close to the Nth stage gate driving unit in a column direction.

11. The electronic device according to claim 9, wherein the first auxiliary driving unit comprises a first thin film transistor;
wherein in the Nth stage first auxiliary driving unit, one of a source and a drain of the first thin film transistor is electrically connected to the second terminal of the Nth scan line, and an other of the source and the drain of the first thin film transistor is electrically connected to the driving source signal line, and a gate of the first thin film transistor is electrically connected to the (N+M)th scan line.

12. The electronic device according to claim 11, wherein the first thin film transistor is an N-channel thin film transistor, and a signal transmitted by the driving source signal line is a constant voltage low potential signal, and the driving source signal line is perpendicular to the plurality of scan lines.

13. The electronic device according to claim 11, wherein the first thin film transistor is an N-channel thin film transistor, and the driving source signal line is the (N+X)th scan line;
wherein X is a positive integer greater than or equal to M+1.

14. The electronic device according to claim 11, wherein the second auxiliary driving unit comprises a second thin film transistor;
wherein in the Nth stage second auxiliary driving unit, one of a source and a drain of the second thin film transistor is electrically connected to the connection node of the Nth scan line, and an other of the source and the drain of the second thin film transistor is electrically connected to the driving source signal line, and a gate of the second thin film transistor is electrically connected to the (N+M)th scan line.

15. The electronic device according to claim 14, wherein the second thin film transistor is of a same type as the first thin film transistor.

16. The electronic device according to claim 14, wherein the display panel further comprises a pixel driving circuit located in the active area, and the pixel driving circuit comprises a plurality of thin film transistors, and the second thin film transistor is arranged in a same layer as at least one of the thin film transistors in the pixel driving circuit.

\* \* \* \* \*